(12) United States Patent  (10) Patent No.: US 8,957,519 B2
Yang et al.  (45) Date of Patent: Feb. 17, 2015

(54) STRUCTURE AND METALLIZATION PROCESS FOR ADVANCED TECHNOLOGY NODES

(75) Inventors: Chih-Chao Yang, Albany, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 12/910,075

(22) Filed: Oct. 22, 2010

(65) Prior Publication Data

US 2012/0098133 A1  Apr. 26, 2012

(51) Int. Cl.
   *H01L 23/48*  (2006.01)
   *H01L 21/321*  (2006.01)
   *H01L 21/02*  (2006.01)
   *H01L 21/768*  (2006.01)

(52) U.S. Cl.
   CPC ........ *H01L 21/321* (2013.01); *H01L 21/02304* (2013.01); *H01L 21/76852* (2013.01); *H01L 21/76886* (2013.01)
   USPC ........................................................ 257/753

(58) Field of Classification Search
   CPC .................. H01L 21/76852; H01L 21/02304; H01L 21/76886; H01L 21/321; H01L 21/02312; H01L 21/02315
   USPC ........................................................ 257/753
   See application file for complete search history.

(56) References Cited

U.S. PATENT DOCUMENTS

| | | |
|---|---|---|
| 5,512,514 A | 4/1996 | Lee |
| 5,668,398 A | 9/1997 | Havemann et al. |
| 5,691,238 A | 11/1997 | Avanzino et al. |
| 5,693,568 A | 12/1997 | Liu et al. |
| 5,915,203 A | 6/1999 | Sengupta et al. |
| 6,051,882 A | 4/2000 | Avanzino et al. |
| 6,208,015 B1 | 3/2001 | Bandyopadhyay et al. |
| 6,399,476 B2 | 6/2002 | Kim et al. |
| 6,673,524 B2 | 1/2004 | Ghandehari et al. |
| 6,861,332 B2 | 3/2005 | Park et al. |
| 6,908,829 B2 | 6/2005 | Hussein et al. |
| 7,071,091 B2 | 7/2006 | Clarke et al. |
| 7,262,130 B1 * | 8/2007 | Ahn et al. ...................... 438/643 |
| 7,329,602 B2 | 2/2008 | Wise et al. |
| 7,595,555 B2 | 9/2009 | Clarke et al. |
| 7,615,498 B2 | 11/2009 | Sasaki et al. |
| 7,691,749 B2 | 4/2010 | Levy et al. |
| 7,727,881 B1 * | 6/2010 | Chattopadhyay et al. .... 438/627 |
| 8,357,609 B2 * | 1/2013 | Ryan .............................. 438/627 |
| 2001/0053600 A1 * | 12/2001 | Morales et al. ................ 438/627 |

(Continued)

OTHER PUBLICATIONS

Pawan Kapur, et al, "Technology and Reliability Constrained Future Copper Interconnects p Part I: Resistance Modeling", IEEE, vol. 49, No. 4, Apr. 2002, pp. 590-597.

(Continued)

*Primary Examiner* — Shaun Campbell (74) *Attorney, Agent, or Firm* — Catherine Ivers (57) ABSTRACT

The problem of poor adherence of a dielectric coating on a patterned metal structure can be solved by forming an adhesion layer on exposed surfaces of such metal structure prior to deposition of such dielectric. According to an embodiment, the invention provides a method to form a self-aligned adhesion layer on the surface of metal interconnect structure within an integrated circuit by exposing the metal structure to a controlled atmosphere and a flow of nitrogen-containing gas.

14 Claims, 7 Drawing Sheets

(56) References Cited

U.S. PATENT DOCUMENTS

| | | |
|---|---|---|
| 2002/0155693 A1 | 10/2002 | Hong et al. |
| 2008/0003818 A1* | 1/2008 | Seidel et al. ............... 438/669 |
| 2009/0239378 A1* | 9/2009 | Kashefizadeh et al. ....... 438/685 |
| 2010/0038782 A1* | 2/2010 | Yang et al. .................. 257/751 |
| 2010/0117236 A1* | 5/2010 | Lin et al. ..................... 257/753 |

OTHER PUBLICATIONS

Shom Ponoth, et al, Pending U.S. Appl. No. 12/885,665, entitled "Structure for Nano-Scale Metallization and Method for Fabricating Same" filed Sep. 20, 2010.

* cited by examiner

STRUCTURE AND METALLIZATION PROCESS FOR ADVANCED TECHNOLOGY NODES

FIELD OF THE INVENTION

The present invention relates to a semiconductor structure, and a method of fabricating the same. More particularly, the present invention relates to nano-scale semiconductor metallization that can have higher than conventional aspect ratios and is compatible with low k dielectric materials. The present invention also provides a method to fabricate such structure while substantially reducing failure due to voids, crack propagation, or delamination at the interface between conductive elements and such dielectric materials.

BACKGROUND OF THE INVENTION

Generally, integrated circuits include a complex network of conductive interconnects fabricated on a semiconductor substrate in which semiconductor devices have been formed. Efficient routing of these interconnects requires formation of multilevel or multilayered schemes, such as, for example, single or dual damascene wiring structures.

Within an interconnect structure, conductive vias run perpendicular to the semiconductor substrate and conductive lines run parallel to the semiconductor substrate. According to conventional damascene processing, lines and vias are created within a dielectric layer. A dielectric layer is patterned to create grooves which become lines and holes which become vias. Metal is deposited on the patterned surface such as by electroplating to fill the grooves and holes. Excess is removed, such as by CMP, thereby forming lines along the top of a given dielectric layer, and forming vias which extend below the lines in order to connect to an underlying layer.

Copper or a Cu alloy has recently been preferred to form the conductive interconnects to provide high speed signal transmission between transistors on a complex semiconductor chip. Copper typically requires a barrier layer to prevent it from migrating into, and thereby degrading the insulating capacity of, surrounding dielectric material. As feature sizes continue to decrease in the ongoing development of more and more densely built integrated circuits, the limitations of dielectric damascene and copper are increasingly apparent. For one, smaller feature size of the conductive features generally requires higher aspect ratio, and it is increasingly difficult to fill such features to form void free metal structures. Forming a barrier layer within high aspect features is particularly difficult. Furthermore, as feature sizes continue to decrease, the barrier cannot scale and hence constitutes a greater fraction of any particular feature. Additionally, as the feature dimensions become comparable to the bulk mean free path, the effective resistivity of copper features will increase because of non-negligible electron scattering at the copper-barrier interface and at grain boundaries. See Pawan Kapur et al., *Technology and Reliability Constrained Future Copper Interconnects—Part 1 Resistance Modeling*, 49: 4, IEEE Transactions on Electron Devices 590 (April 2002).

Some challenges associated with copper damascene can be avoided by forming the interconnect structure by an alternate metal using subtractive metal etch ("SME"), as for example is discussed in co-pending U.S. application Ser. No. 12/885,665 ("Ponoth et al.") entitled "STRUCTURE FOR NANO-SCALE METALLIZATION AND METHOD FOR FABRICATING SAME" and is hereby incorporated by reference. In SME, a metal layer is deposited, then etched according to one or more patterns to remove all but the interconnect structures.

Figure 1:
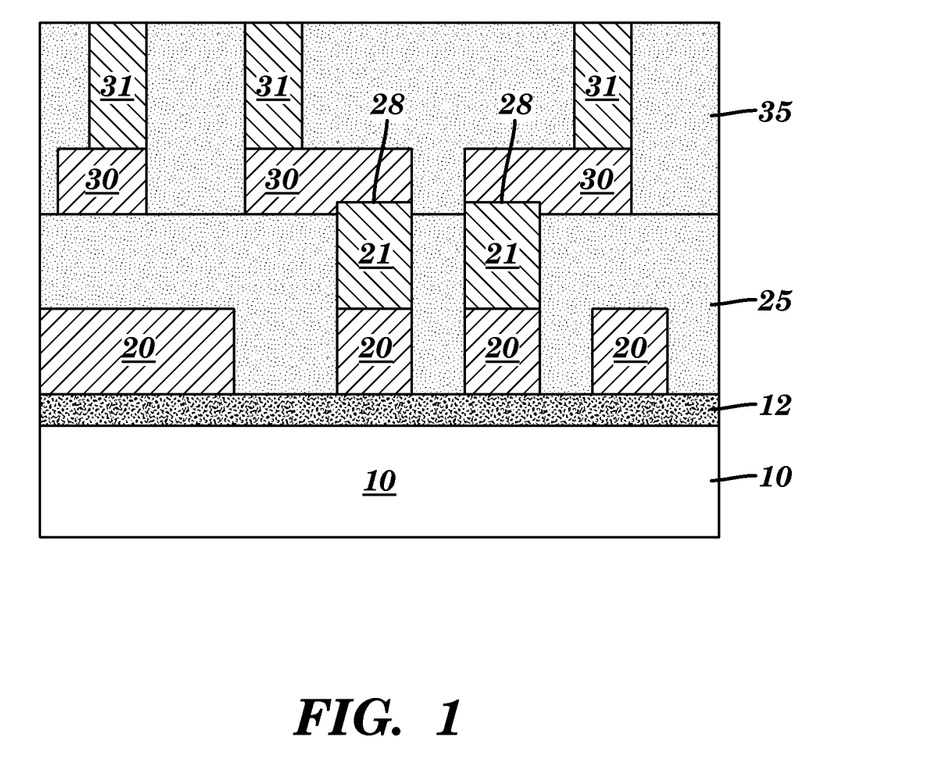
FIG. 1 is a cross section of a prior art interconnect structure.

For example, referring to FIG. 1 which represents an integrated circuit according to Ponoth et al., an isolation layer 12 overlies a semiconductor substrate 10, within which at least one semiconductor device has been formed (not shown). A first metal layer may be deposited as a single layer or as a composite of several deposited layers. A first etch to a first depth according to a first pattern defines at least the portion that will become vias 21. A second etch through to isolation layer 12 according to a second pattern leaves wires 20 having depth of the second etch depth and any portions masked by both patterns as vias 21 extending the full height (depth) of the first metal layer. A dielectric layer 25 is deposited over the exposed substrate and the etched first layer metal features. Dielectric layer 25 can be recessed to expose top portions 28 of vias 21. A second interconnect layer of lines 30, vias 31, and dielectric layer 35, can be formed in the same way as the first metal layer. Lines 30 and vias 31 can be aligned with the features of the first metal layer by reference to the location of exposed top portions 28.

A problem with forming multi-layered interconnect structure by subtractive metal etch, however, is that dielectric materials, particularly Si-containing dielectric materials and more particularly porous, low-k dielectric materials, do not adhere well to the patterned metal. Poor adhesion makes the resultant interconnect structure susceptible to failure. Direct deposition of dielectric materials onto such bare metal can produce a structure susceptible to cracking, delamination, or other failure. For example, delamination can occur during fabrication due to stresses from mechanical polishing or from different thermal expansion characteristics of adjacent materials. Poor adhesion can also lead to failure by electromigration.

SUMMARY OF THE INVENTION

According to the present disclosure, the problem of poor adherence of a dielectric coating on a patterned metal structure can be solved by forming an adhesion layer on exposed surfaces of such metal structure prior to deposition of such dielectric. According to an embodiment, the invention provides a method to form a self-aligned adhesion layer on the surface of metal interconnect structure within an integrated circuit by exposing the metal structure to a controlled atmosphere and a flow of nitrogen-containing gas.

According to another aspect, the invention provides a method to adhere a dielectric coating over a patterned metal structure by exposing metal surfaces of such structure to a controlled atmosphere under conditions that form a nitrogen-containing layer directly on such surfaces, and then depositing a dielectric coating.

In another embodiment, the invention provides a method to form an interconnect layer in an integrated circuit wherein the interconnect layer includes conductive structure embedded within dielectric material and wherein a self-aligned adhesion layer forms an interface between such conductive structure and said dielectric material.

In another embodiment, the invention provides a structure having a self-aligned adhesion layer between a patterned metal structure and the dielectric material in which such patterned metal structure is embedded.

DETAILED DESCRIPTION OF THE INVENTION

Embodiments of the present invention will now be described in greater detail by reference to the drawings that accompany the present application. It is noted that the drawings of the present application are provided for illustrative purposes only and are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
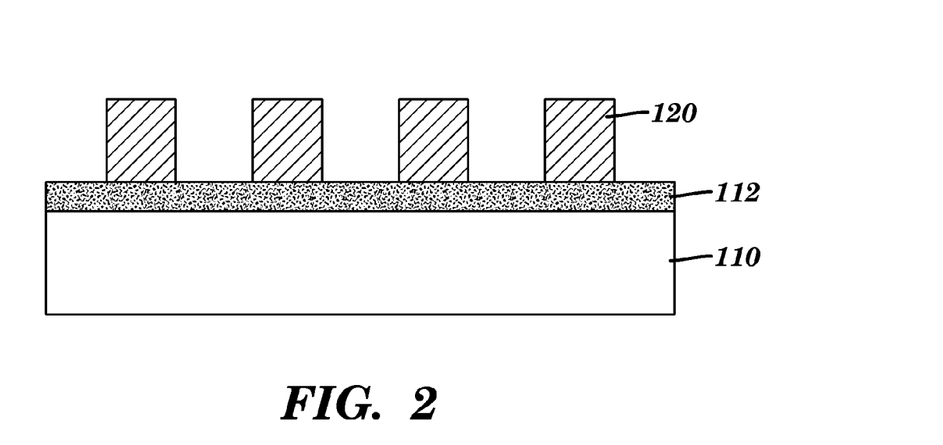
FIG. 2 illustrates a first exemplary structure according to an embodiment of the present disclosure.

Referring now to FIG. 2, a first exemplary structure according to a first embodiment of the present invention includes a substrate 110, and a patterned metal layer 120. Intermediate layer 112 is optional and may be a dielectric capping layer. Substrate 110 can be a partially-formed semiconductor that contains active device elements formed by front-end of the line (FEOL) processing or that contains interconnect structure to electrically connect such device elements to each other or to connections or structure external to the substrate. Substrate 110 can be a wafer that may subsequently be diced into chips, or can be a chip. Patterned metal layer 120 may be formed by depositing and patterning a metal layer as disclosed in Ponoth et al.

FIG. 2 illustrates a simple patterned metal layer 120 comprising four discrete structures, each having vertical side walls and a horizontal top surface, all such top surfaces being coplanar. Note that the invention contemplates any patterning of layer 120, such as, for example, elements having two or more heights or a contoured top surface, different heights for separate structures, and/or contoured side surfaces for any or all such discrete structures.

Substrate 110 may comprise a semiconducting material, a conductive material or any combination thereof. When the substrate comprises a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

When substrate 110 is a conducting material, the substrate may include, for example, polySi, an elemental metal, alloys of elemental metals, a metal silicide, a metal nitride or combinations thereof including multilayers. Further, the substrate 110 can be single crystalline, polycrystalline, amorphous, or have a combination of at least two of a single crystalline portion, a polycrystalline portion, and an amorphous portion.

Optional layer 112 can be any insulating material which can be an organic insulator, an inorganic insulator or a combination thereof including multilayers. Examples of suitable dielectrics that can be used as layer 112 include, but are not limited to SiN, SiC, $SiO_2$, silsesquioxanes, C doped oxides (i.e., organosilicates) that include atoms of Si, C, O and H, including dense or porous versions of the foregoing, or combinations thereof.

First metal layer 120 is conductive and can be a refractory metal or any metal that can be dry etched including but not limited to Al, Cr, Cu, Co, Ni, Hf, Ir, Mo, Nb, Os, Re, Rh, Ru, Ta, Ti, W, V, Zr, and alloys thereof. First metal layer 120 is preferably formed by one or more of Aluminum, Copper, Molybdenum, Nickel, Ruthenium, Tungsten or Cobalt. First metal layer 120 is most preferably tungsten. First metal layer 120 can comprise two or more separately deposited materials, which can be deposited in layers, or may form separate regions of said layer. According to one embodiment, layer 120 can include a thin under-layer formed to promote a characteristic in a subsequently formed main metal layer, for example, a particular crystal form or a specific crystal orientation. The material of such under layer would depend upon the material of the main metal layer. Alternatively, an under-layer could constitute an etch stop. In another embodiment, an earlier-formed layer may ultimately constitute a conductive line while a later-formed layer may ultimately constitute a via extending up to the next layer from such conductive line. In yet another embodiment, a first metal can be formed within first open regions of a patterned layer, then second openings can be formed in such patterned layer, and a second metal region can be formed by filling such second openings.

Figure 3:
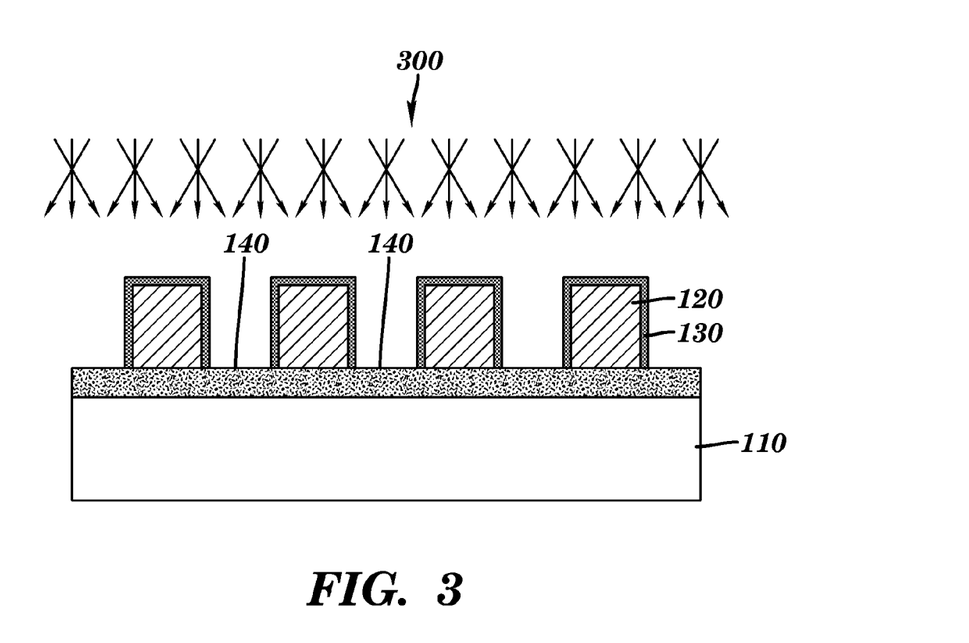
FIG. 3 illustrates a surface treatment according to an embodiment of the present disclosure.

Referring now to FIG. 3, patterned metal layer 120 is exposed to atmosphere 300 whereby nitrogen constituents of atmosphere 300 react with surface portions of patterned metal layer 120 to form a nitrogen-containing layer 130 on the metal surface. In the case that metal layer 120 comprises a refractory or other metal, layer 130 can comprise the corresponding metal nitride, e.g., if metal layer 120 is tungsten, then layer 130 can comprise $WN_2$. Optimally, all exposed surfaces of patterned metal layer 120 react with the constituents such that layer 130 is self-aligned, that is, it covers all surfaces of patterned metal layer 120, and yet does not form at all on other exposed surfaces 140. Without wishing to be bound by theory, it is believed that nitrogen-containing layer 130, upon being coated by a silicon-containing dielectric material, promotes formation of SiN or $Si_xN_{1-x}$ (x ranging from 0 to 1) bonds and thereby contributes a significant level of adhesion enhancement.

In a first embodiment, layer 130 can be formed by a thermal process. Substrate 110 having patterned metal layer 120 thereon is placed in a chamber. The temperature of controlled atmosphere 300 within the chamber is between 150 C and 600 C and the pressure is between $10^{-6}$ and $10^{-10}$ torr. The temperature of atmosphere 300 can be between 150 C and 500 C and is preferably between 200 C and 300 C. The pressure can be between $10^{-7}$ and $10^{-8}$ torr, such as by turbo-pump.

A nitrogen-containing gas can be introduced to atmosphere 300 thereby exposing patterned metal layer 120. The gas of atmosphere 300 includes nitrogen which can be in the form of $N_2$, $N_2H_2$, or $NH_3$. The gas composition can be essentially pure gas selected from the group of $N_2$, $N_2H_2$, $NH_3$ and combinations thereof. The gas of atmosphere 300 can contain less than 100 ppm impurity, and is preferably 99.999% pure $N_2$, $NH_3$, $N_2H_2$, or mixtures thereof with 10 ppm or less impurities. The flow can be up to 1800 sccm. A preferred flow is between 50 sccm and 1650 sccm. The pressure of atmosphere 300 can increase while the gas is introduced. For example, at 50 sccm the pressure may be controlled between $10^{-4}$ and $10^{-7}$ torr and is preferably at about $10^{-6}$ torr, whereas at a flow between 1300 to 1650 sccm the pressure may be controlled at less than 10 torr. At a flow of about 1500 sccm the pressure is preferably between 1 and 10 torr.

The thickness of layer 130 can be controlled in the thermal process by process conditions and exposure time. Exposure time can be between 2 and 10 minutes.

In another embodiment, layer 130 can be formed by a plasma enhanced thermal process. As with the thermal only process, substrate 110 having patterned metal layer 120 thereon is placed in a chamber. The temperature of controlled atmosphere 300 within the chamber is between 100 C and 400 C and the pressure is between $10^{-6}$ and $10^{-10}$ torr. The temperature of atmosphere 300 is preferably between 250 C and 300 C. The pressure can be between $10^{-7}$ and $10^{-8}$ torr.

A nitrogen-containing gas can be introduced to atmosphere 300 thereby exposing patterned metal layer 120 as well as a plasma which can be initiated by Ar, He, Ne, Xe, H2, or mixtures thereof, and preferably is initiated by Ar. The nitrogen-containing gas can be the same composition as for the thermal only process. The flow can be up to 1700 sccm. Flow between 1475 and 1540 sccm can be effective with bias of top electrode between 450 W and 550 W, and preferably about 500 W, and with table bias between 375 and 430 W and preferably about 400 W. Depth of layer 130 can be controlled by process time and temperature which can be between 5 minutes and 1 minute for 100 C and 400 C process conditions, respectively.

Both the thermal and the plasma enhanced processes can be performed inside a high-vacuum controlled chamber like the Endura, Inova, and Tiras fabricated by Applied Materials, Novellus, and Tokyo Electron, respectively.

Figure 4A:
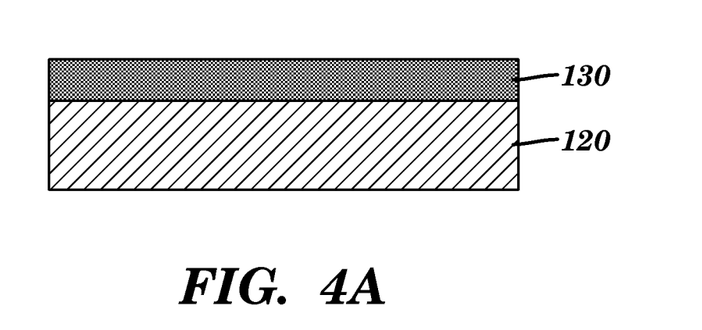
FIGS. 4A and 4B illustrate variations of a surface treatment according to the present disclosure.
Figure 4B:
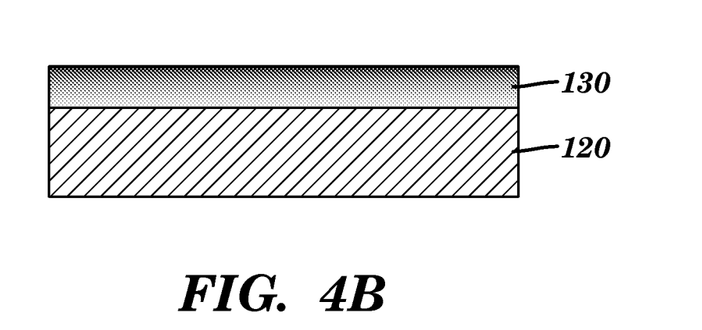

Layer 130 can be formed to a thickness between 5 A and 200 A, in which 20 A to ~50 A is preferred. Layer 130 can be formed as a monolayer or a thicker layer having a uniform composition as illustrated by FIG. 4A. Layer 130 having a uniform composition is preferably formed by a thermal-only process. Layer 130 can be formed having a graduated composition such that the nitrogen concentration gradually decreases with depth of layer 130 as illustrated by FIG. 4B. Layer 130 having a graduated composition is preferably formed by a plasma-enhanced thermal process. The thickness and composition profile can be controlled by both the process time and process bias.

Figure 5:
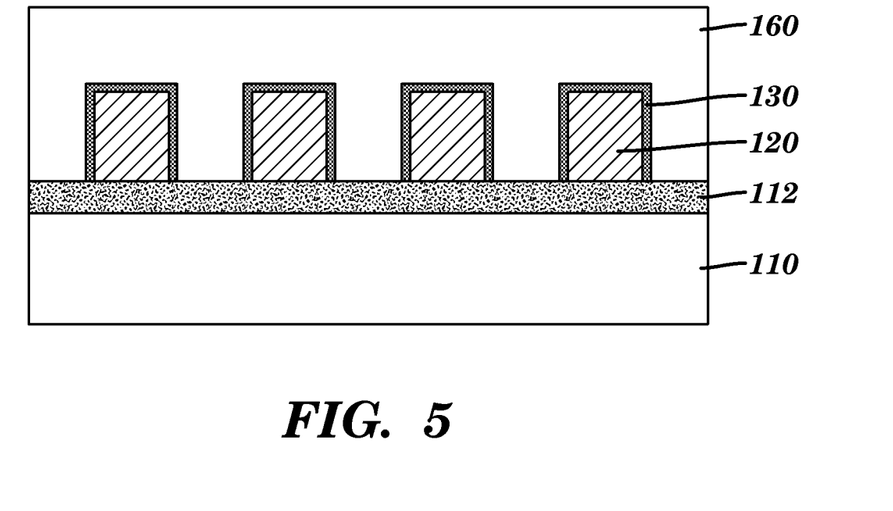
FIGS. 5, 6A and 6B illustrate further processing of an exemplary structure according to the present disclosure.

Referring now to FIG. 5, after forming adhesion layer 130, dielectric material 160 can be deposited over patterned metal layer 120. Patterned metal layer 120 can be completely covered by dielectric material 160. Dielectric material 160 can be any interlevel or intralevel dielectric (ILD), including inorganic dielectrics or organic dielectrics, and can be porous or non-porous. Examples of suitable dielectrics that can be used as dielectric material 160 include, but are not limited to SiN, SiC, $SiO_2$, silsesquioxanes, C doped oxides (i.e., organosilicates) that include atoms of Si, C, O and H, including porous versions of the foregoing, or combinations thereof. Preferred dielectrics include SiCOH (Organosilicate glass), SiLK (Aromatic thermosets), FSG (Fluorosiicate glass), BCB (Benzocyclobutene polymers), HSQ (Hydrogen-silsesquioxane), and MSQ (Methyl-silsesquioxane). Dielectric material 160 is preferably a low-k material, with k value between 1.5 and 3.5, more preferably with k between 2.0 and 3.0.

Dielectric material 160 can be deposited utilizing any conventional deposition process including, but not limited to chemical vapor deposition (CVD), plasma enhanced chemical vapor deposition (PECVD), spin-on coating, evaporation, and chemical solution deposition. Spin-on coating can be preferable by resulting in less overburden and thereby reducing the need for or demand upon a subsequent planarization step such as CMP.

Figure 6A:
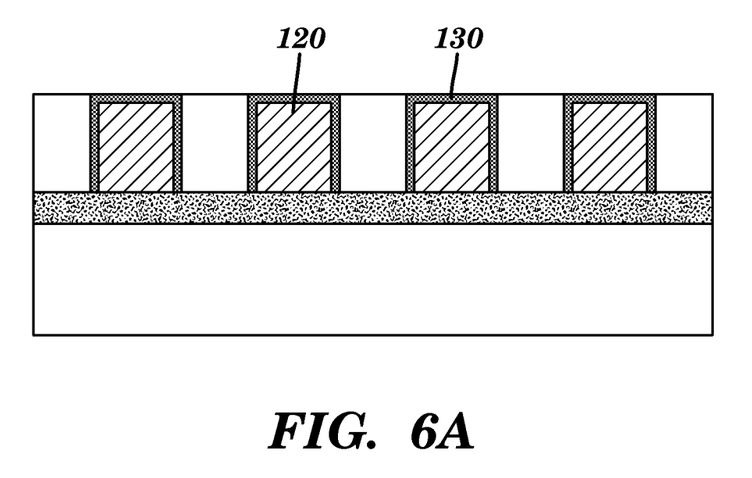
Figure 6B:
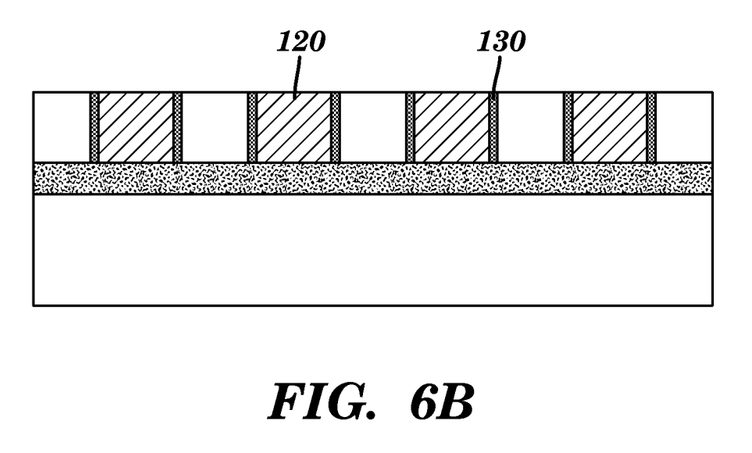

Prior to forming a second interconnect layer by essentially repeating the foregoing processes, excess dielectric material 160 can be removed using a planarization process, which could be, for example, chemical mechanical polishing and/or grinding. Typically, chemical mechanical polishing is employed. Optionally, layer 160 can be deposited such that ILD etch back, rather than CMP, is sufficient to smooth the surface. Whether by etch, CMP, or otherwise, the process can be stopped so that bonding layer 130 remains over the top of metal structure 120 as shown in FIG. 6A, or can proceed to remove layer 130 from the top surface of metal structure 120 as shown in FIG. 6B.

Figure 7A:
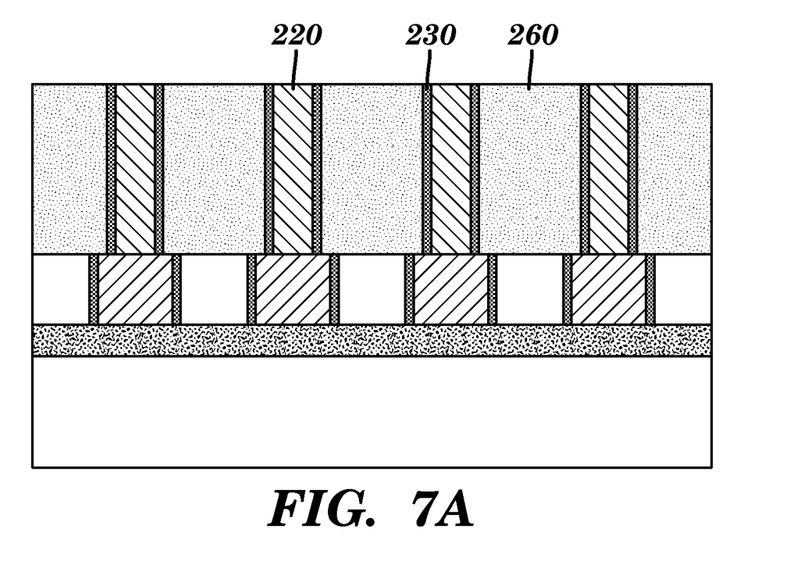
FIGS. 7A-7C illustrate variations of a second layer according to the present disclosure.
Figure 7B:
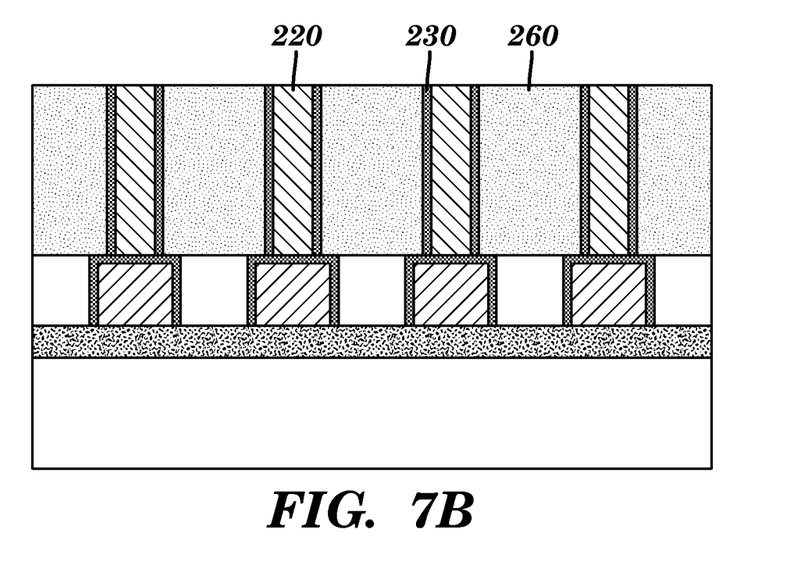
Figure 7C:
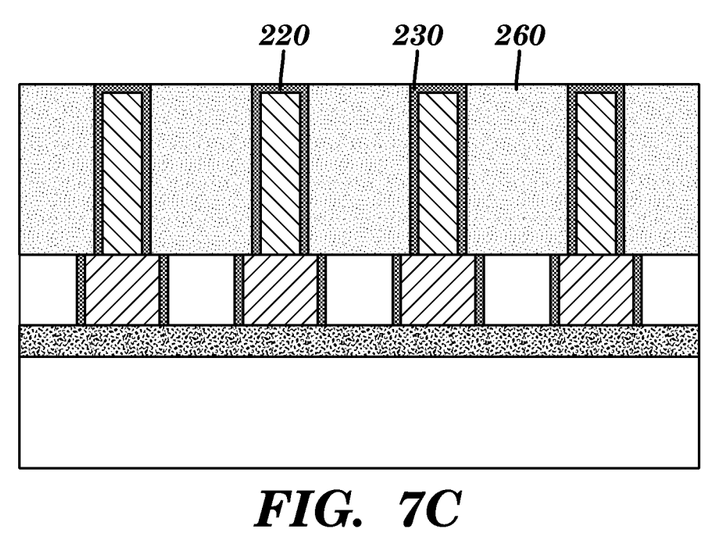

A second interconnect layer comprising a second patterned metal layer 220 embedded within dielectric layer 260 can be formed by repeating the foregoing steps. A second metal layer can be deposited and patterned by subtractive metal etch. The second patterned layer 220 can be formed of the same materials as patterned metal layer 120. Typically, but not necessarily, the second metal layer will be patterned differently from the first metal layer. The second interconnect layer can be completed by forming a self-aligned bonding layer 230 by exposing second patterned metal layer 220 to atmosphere 300 as described above, and embedding second patterned metal layer 220 in dielectric layer 260, which can be formed of the same materials and by the same processes as dielectric layer 160. Second patterned metal layer 220 can be formed over the structure of FIG. 6B such that it directly contacts first patterned metal structure 120 as illustrated by FIG. 7A. Second patterned metal layer 220 can alternatively be formed over the structure of FIG. 6A such that it directly contacts bonding layer 130 as illustrated by FIG. 7B. The second interconnect layer can be planarized to retain or remove bonding layer 230 from the top most surfaces of second patterned layer 220 as illustrated respectively by FIGS. 7C and 7B.

While the present invention has been particularly shown and described with respect to preferred embodiments thereof, it will be understood by those skilled in the art that the foregoing and other changes or details may be made without departing from the spirit and scope of the present invention. It is therefore intended that the present invention not be limited to the exact forms and details described and illustrated, but fall within the scope of the appended claims.

What is claimed is:

1. A method to form a self-aligned adhesion layer within an integrated circuit, wherein said integrated circuit includes metal interconnect structure disposed on a substrate, said metal interconnect structure conductively connected to at least one semiconductor device formed in said substrate, the method comprising:
   forming said metal interconnect structure by a subtractive metal etch process such that the metal interconnect structure has an exposed top surface metal and a plurality of exposed etched sidewall metal surfaces;

forming said self-aligned adhesion layer consisting of nitrogen compounded with the exposed etched sidewall metal surfaces of said metal interconnect on said metal interconnect structure, wherein said self-aligned adhesion layer has a graduated nitrogen concentration that decreases with depth and wherein the self-aligned adhesion layer is electrically conductive.

2. The method of claim 1 further comprising:

sustaining said forming step for a time effective to form said self-aligned adhesion layer to a thickness greater than 5 A.

3. The method of claim 1 wherein said exposed etched sidewall metal surfaces comprises tungsten (W), ruthenium (Ru), rhodium (Rh), nickel (Ni), cobalt (Co), or molybdenum (Mo), and further comprising: depositing a silicon-containing dielectric material directly onto said adhesion layer.

4. The method of claim 3 wherein the step of forming said self-aligned adhesion layer further comprises:

exposing said the metal interconnect structure having said exposed top surface metal and said plurality of exposed etched sidewall metal surfaces to a controlled atmosphere, wherein said controlled atmosphere is at a temperature between 100 C and 600 C and at a pressure between $10^{-6}$ and $10^{-10}$ torr, and introducing a flow of gas comprising one or more of $N_2$, $NH_3$, and $N_2H_2$ to form said self-aligned adhesion layer consisting of nitrogen compounded with the exposed etched sidewall metal surfaces of said metal interconnect on said metal interconnect structure.

5. The method of claim 3 wherein said wherein said exposed etched sidewall metal surfaces comprises tungsten, and wherein said dielectric material is a low-k material with k value below 3.5.

6. The method of claim 3 wherein said dielectric material comprises at least one of SiCOH, SiLK (Aromatic thermosets), FSG (Fluorosilicate glass), BCB (Benzocyclobutene polymers), HSQ (Hydrogen-silsesquioxane), or MSQ (Methyl-silsesquioxane).

7. The method of claim 4, wherein said controlled atmosphere further comprises a plasma initiated by one or more of $H_2$, Ar, He, Kr, Ne, Xe, and Rn.

8. The method of claim 4, wherein said temperature is between 200 C and 300 C.

9. The method of claim 3, wherein said depositing is accomplished by spin-on, chemical vapor deposition, or a combination thereof.

10. The method of claim 4, wherein the self-aligned adhesion layer has a thickness between 5 A and 200 A.

11. An interconnect structure comprising:

a metal structure comprising a plurality of metal lines structures disposed on a substrate, wherein each of the metal structures has a sidewall;

an electrically conductive nitride layer formed on said sidewall of said metal structure, said nitride layer consisting of nitrogen compounded with a metal of said metal structure, wherein said nitride layer has a graduated nitrogen concentration; and a silicon-containing dielectric material completely filling between at least two of said plurality of metal structures and said silicon-containing dielectric material directly on said nitride layer.

12. The structure of claim 11 wherein said dielectric material is a low-k material with k value below 3.5.

13. The structure of claim 11 wherein said nitride layer has a thickness greater than 5 A.

14. The structure of claim 11 wherein said nitride layer has a graduated nitrogen concentration that decreases with depth.

* * * * *